United States Patent
Liao

(10) Patent No.: US 11,659,327 B2
(45) Date of Patent: May 23, 2023

(54) SIGNAL PROCESSOR AND SIGNAL PROCESSING METHOD

(71) Applicant: REALTEK SEMICONDUCTOR CORPORATION, Hsinchu (TW)

(72) Inventor: Chen Fong Liao, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/398,720

(22) Filed: Aug. 10, 2021

(65) Prior Publication Data

US 2022/0400340 A1   Dec. 15, 2022

(30) Foreign Application Priority Data

Jun. 10, 2021  (TW) ................................ 110121131

(51) Int. Cl.
| | |
|---|---|
| *H04R 3/02* | (2006.01) |
| *H03F 3/183* | (2006.01) |
| *H04R 3/04* | (2006.01) |
| *H03D 7/00* | (2006.01) |

(52) U.S. Cl.
CPC ................ *H04R 3/02* (2013.01); *H03D 7/00* (2013.01); *H03F 3/183* (2013.01); *H04R 3/04* (2013.01); *H03F 2200/03* (2013.01)

(58) Field of Classification Search
CPC .... H04R 3/02; H04R 3/04; H03D 7/00; H03F 3/183; H03F 2200/03
USPC .................................................... 381/94, 94.2
See application file for complete search history.

(56) References Cited

U.S. PATENT DOCUMENTS

| | | | |
|---|---|---|---|
| 2019/0081621 A1* | 3/2019 | Schinkel | ................ H04R 1/005 |
| 2020/0213778 A1* | 7/2020 | Bhat | ..................... H03F 1/3258 |

* cited by examiner

*Primary Examiner* — Vivian C Chin
*Assistant Examiner* — Friedrich Fahnert
(74) *Attorney, Agent, or Firm* — WPAT, P.C., Intellectual Property Attorneys; Anthony King

(57) ABSTRACT

A signal processor is configured to decrease total harmonic distortion plus noise of an output signal generated from an input signal. The signal processor includes a mixer, a pulse-width modulator, a power stage circuit, and a feedback circuit. The mixer is configured to mix the input signal and a feedback signal to generate a mixed signal. The pulse-width modulator is configured to module the mixed signal to generate a modulated signal and output the modulated signal from an output terminal of the pulse-width modulator. The power stage circuit is configured to amplify the modulated signal to generate the output signal and output the output signal from an output terminal of the power stage circuit. The feedback circuit is configured to generate a feedback signal selectively according to the modulated signal or the output signal.

20 Claims, 3 Drawing Sheets

SIGNAL PROCESSOR AND SIGNAL PROCESSING METHOD

CROSS-REFERENCE TO RELATED APPLICATIONS

This application claims the benefit of priority to Patent Application No. 110121131, filed in Taiwan on Jun. 10, 2021, which is incorporated by reference in its entirety.

TECHNICAL FIELD

The present application relates to a processor and a processing method, particularly a signal processor and a signal processing method.

BACKGROUND

After the audio signal is processed by the digital-pulse width modulation, the total harmonic distortion plus noise (THD+N) at its output terminal would affect the quality of the signal transmission. In the conventional digital pulse-width modulation method, the noise floor in the path of the audio processing system is often increased due to suppressing the harmonics, and hence, the user can feel obvious background noise when the audio signal is relatively small.

SUMMARY OF THE INVENTION

An aspect of the present disclosure provides a signal processor configured to decrease a total harmonic distortion plus noise of an output signal generated from an input signal. The signal processor includes a mixer, a pulse-width modulator, a power stage circuit, and a feedback circuit. The mixer is configured to generate a mixed signal according to the input signal and a feedback signal. The pulse-width module is configured to modulate the mixed signal to generate a modulated signal to be outputted from an output terminal of the pulse-width module. The power stage circuit is configured to amplify the modulated signal to generate an output signal to be outputted from an output terminal of the power stage circuit. The feedback circuit is configured to generate the feedback signal to the mixer selectively according to the modulated signal or the output signal.

Another aspect of the present disclosure provides signal processing method configured to decrease a total harmonic distortion plus noise of an output signal generated from an input signal. The signal processing method includes the steps of: generating a mixed signal according to the input signal and a feedback signal; modulating the mixed signal to generate a modulated signal; amplifying the modulated signal to generate the output signal; and selectively generating the feedback signal according to the modulated signal or the output signal.

The signal processor and the signal processing method of the present disclosure feedback different feedback signals according to the scale of the signal to suppress the harmonics and noise of the output signal. Compared with the conventional arts, the signal processor and the signal processing method of the present disclosure have a higher capability for suppressing harmonics and noises.

DETAILED DESCRIPTION

Figure 1:
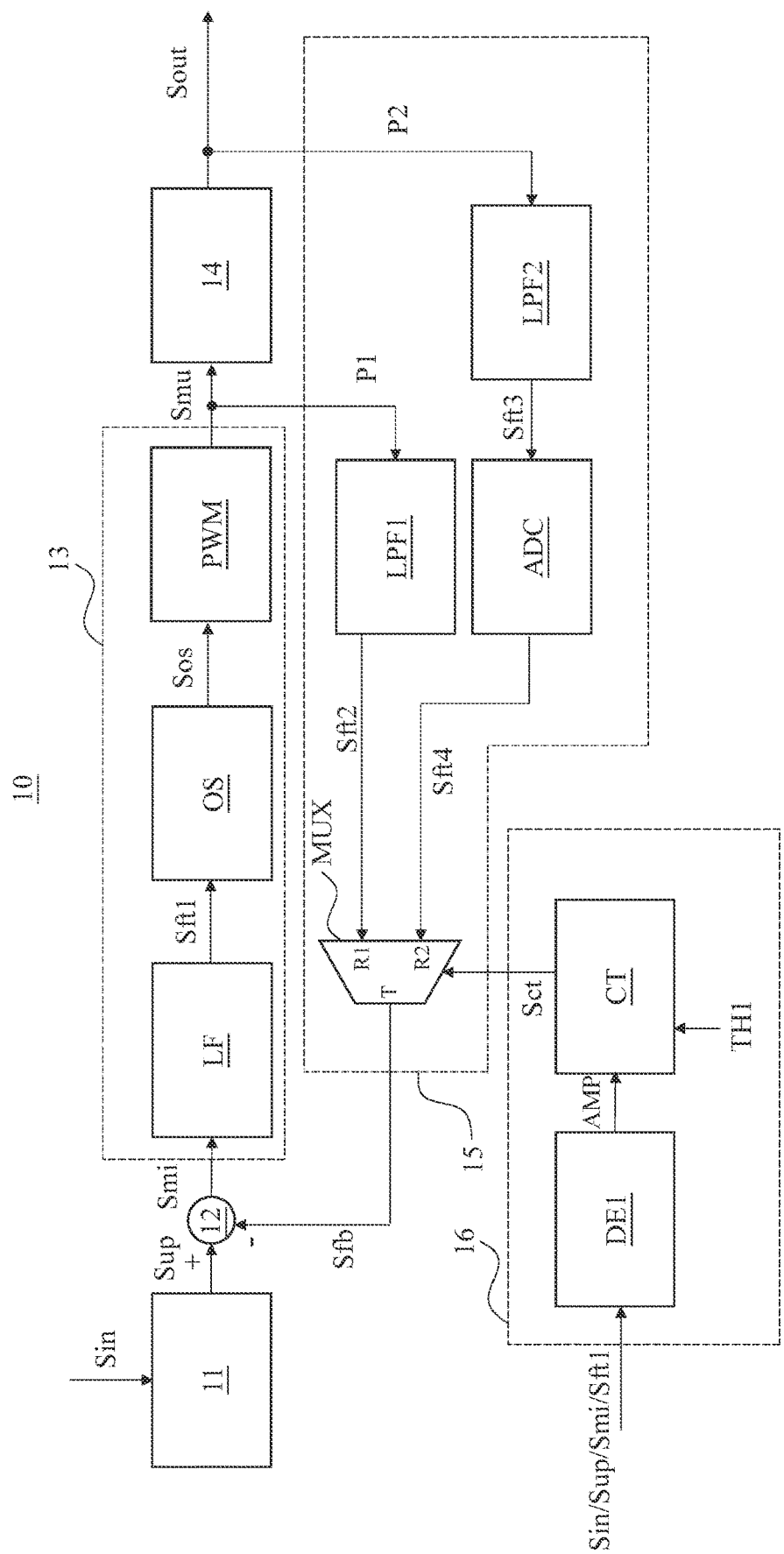
FIG. 1 is a schematic diagram illustrating a signal processor according to some embodiments of the present disclosure.

FIG. 1 is a schematic diagram illustrating a signal processor 10 according to some embodiments of the present disclosure. The signal processor 10 is configured to process an input signal Sin to generate an output signal Sout. In some embodiments, the input signal Sin and the output signal Sout are audio signals, the signal processor 10 generates the output signal Sout to a speaker (not shown in the drawings), so that the speaker plays the audio corresponding to the output signal Sout.

The signal processor 10 includes an up-sampler 11, a mixer 12, a pulse-width module 13, a power stage circuit 14, a feedback circuit 15, and a control circuit 16. The up-sampler 11 is configured to up-sampling the input signal Sin to generate an up-sampled signal Sup. The mixer 12 is configured to mix the up-sampled signal Sup and a feedback signal Sfb to generate a mixed signal Smi. More specifically, the mixer 12 is configured to subtract the feedback signal Sfb from the up-sampled signal Sup to generate the mixed signal Smi. The pulse-width module 13 is configured to modulate the mixed signal Smi to generate a modulated signal Smu and output the same from the output terminal of the pulse-width module 13. The above-mentioned input signal Sin, up-sampled signal Sup, feedback signal Sfb, mixed signal Smi, and modulated signal Smu are all digital signals. The power stage circuit 14 is configured to amplify the modulated signal Smu and perform a digital-to-analog conversion thereon to generate an analog output signal Sout, which is to be outputted from the terminal output of the power stage circuit 14. The feedback circuit 15 selects the modulated signal Smu or the output signal Sout according to the control signal Sct and generate the feedback signal Sfb to the mixer 12 according to the selected modulated signal Smu or output signal Sout. The control circuit 16 is configured to generate a control signal Sct according to the input signal Sin.

The pulse-width module 13 includes a loop filter LF, an over-sampler OS, and a pulse-width modulator PWM. The loop filter LF is configured to filter the mixed signal Smi to generate a filtered signal Sft1. The over-sampler OS is configured to over-sample the filtered signal Sft1 to generate an over-sampled signal Sos. The pulse-width modulator PWM is configured to modulate the over-sampled signal Sos to generate the modulated signal Smu. In some embodiments, the over-sampler OS is a sigma-delta modulator.

The feedback circuit 15 includes a multiplexer MUX, a feedback path P1, and a feedback path P2. The feedback path P1 is coupled between the input terminal R1 of the multiplexer MUX and the output terminal of the pulse-width module 13. The feedback path P2 is coupled between the input terminal R2 of the multiplexer MUX and the output terminal of the power stage circuit 14. The output terminal T of the multiplexer MUX is coupled to the mixer 12.

The feedback path P1 includes a filter LPF1, which is configured to filter the modulated signal Smu to generate a filtered signal Sft2 to the input terminal R1.

The feedback path P2 includes a filter LPF2 and an analog-to-digital converter ADC, wherein the filter LPF2 is coupled between the output terminal of the power stage circuit 14 and the analog-to-digital converter ADC, and the analog-to-digital converter ADC is coupled between the output terminal of the filter LPF2 and the input terminal R2 of the multiplexer MUX. The filter LPF2 is configured to filter the output signal Sout to generate a filtered signal Sft3. Because the output signal Sout and the filtered signal Sft3 are analog signals, the feedback path P2 can use the analog-to-digital converter ADC to perform an analog-to-digital conversion on the filtered signal Sft3 to generate a digitally converted filtered signal Sft4 to the input terminal R2. In some embodiments, the analog-to-digital converter ADC is a sigma-delta modulating analog-to-digital converter.

In some embodiments, the passband of the filter LPF1 is substantially identical to the passband of the filter LPF2, and hence the spectrum of the filtered signal Sft2 is substantially identical to the spectrum of the converted filtered signal Sft4.

The multiplexer MUX is configured to selectively couple the input terminal R1 or the input terminal R2 to the output terminal T according to the control signal Sct; that is, the multiplexer MUX can selectively output the filtered signal Sft2 or the converted filtered signal Sft4 to be the feedback signal Sfb.

When the power stage circuit 14 amplifies the modulated signal Smu, the thus-generated output signal Sout can have harmonics corresponding to the frequency of the modulated signal Smu because of the linearity of the power stage circuit 14. Hence, the signal processor 10 uses the feedback path P2 of the feedback circuit 15 to process the output signal Sout and then returns the feedback to the mixer 12, to assist in suppressing harmonics using a loop of forward path (includes the up-sampler 11, the mixer 12, the pulse-width module 13, and the power stage circuit 14) and the feedback path P2, in which the harmonics is generated by the power stage circuit 14.

However, the feedback path P2 contributes additional noises, causing the noise floor of the signal processor 10 to rise. When the input signal Sin is greater, the feedback path P2 can significantly suppress the harmonics generated by the power stage circuit 14, i.e., significantly reduce the THD+N of the output signal Sout. However, because the input signal Sin is greater, the suppressed harmonics are still greater than the additional noise contributed by the feedback path P2, so that drawback that the feedback path P2 may contribute additional noise can be ignored.

Nevertheless, when the input signal Sin is small, the harmonic generated by the power stage circuit 14 is significantly reduced, so that the defect of additional noise contributed by the feedback path P2 becomes apparent. In other words, when the input signal Sin is small, the noise contributed by the feedback path P2 accounts for most of the THD+N of the output signal Sout. To solve this problem, the present disclosure proposes the embodiment shown in FIG. 1, in which if the magnitude of the noise contributed by the feedback path P2 is close to or even greater than the magnitude of the harmonic component in the output signal Sout, the signal processor 10 stops using the feedback path P2 and instead uses the feedback path P1, which contributes less noise, to filter and return the modulated signal Smu to the mixer 12.

In some embodiments, the analog-to-digital converter ADC is the main contributor to the noise on the feedback path P2. Because there are no other analog-to-digital converters on the feedback path P1, the noise generated from the signal passing through the feedback path P1 is less than the noise generated from the signal passing through the feedback path P2. Therefore, when the energy of the input signal Sin is considerably small, the signal processor 10 uses a loop of the forward path and the feedback path P1 to generate the output signal Sout so as to decrease the noise, thereby decreasing the THD+N of the output signal Sout.

The control circuit 16 is configured to generate the control signal Sct according to one of the input signal Sin, the up-sampled signal Sup, the mixed signal Smi, and the filtered signal Sft1. Specifically, the control circuit 16 includes the detector DE1 and the comparator CT. The control circuit 16 is configured to calculate the amplitude AMP of one of the input signal Sin, the up-sampled signal Sup, the mixed signal Smi, and the filtered signal Sft1, and transmit the same to the comparator CT. The comparator CT is configured to compare the amplitude AMP and the first threshold TH1. When the amplitude AMP is greater than or equal to the first threshold TH1, the comparator CT generates the control signal Sct, which is configured to instruct that the multiplexer MUX to couple the input terminal R2 to the output terminal T, so as to output the converted filtered signal Sft4 as the feedback signal Sfb. When the amplitude AMP is smaller than the first threshold TH1, the comparator CT generates the control signal Sct, which is configured to instruct the multiplexer MUX to couple the input terminal R1 to the output terminal T, so as to output the filtered signal Sft2 as the feedback signal Sfb. In other embodiments, the detector DE1 is configured to calculate the energy of one of the input signal Sin, the up-sampled signal Sup, the mixed signal Smi, and the filtered signal Sft1, and compare it with the first threshold TH1. However, the present disclosure is not limited thereto, and any technical solutions capable of determining the signal scale fall within the scope of the present disclosure.

Figure 2:
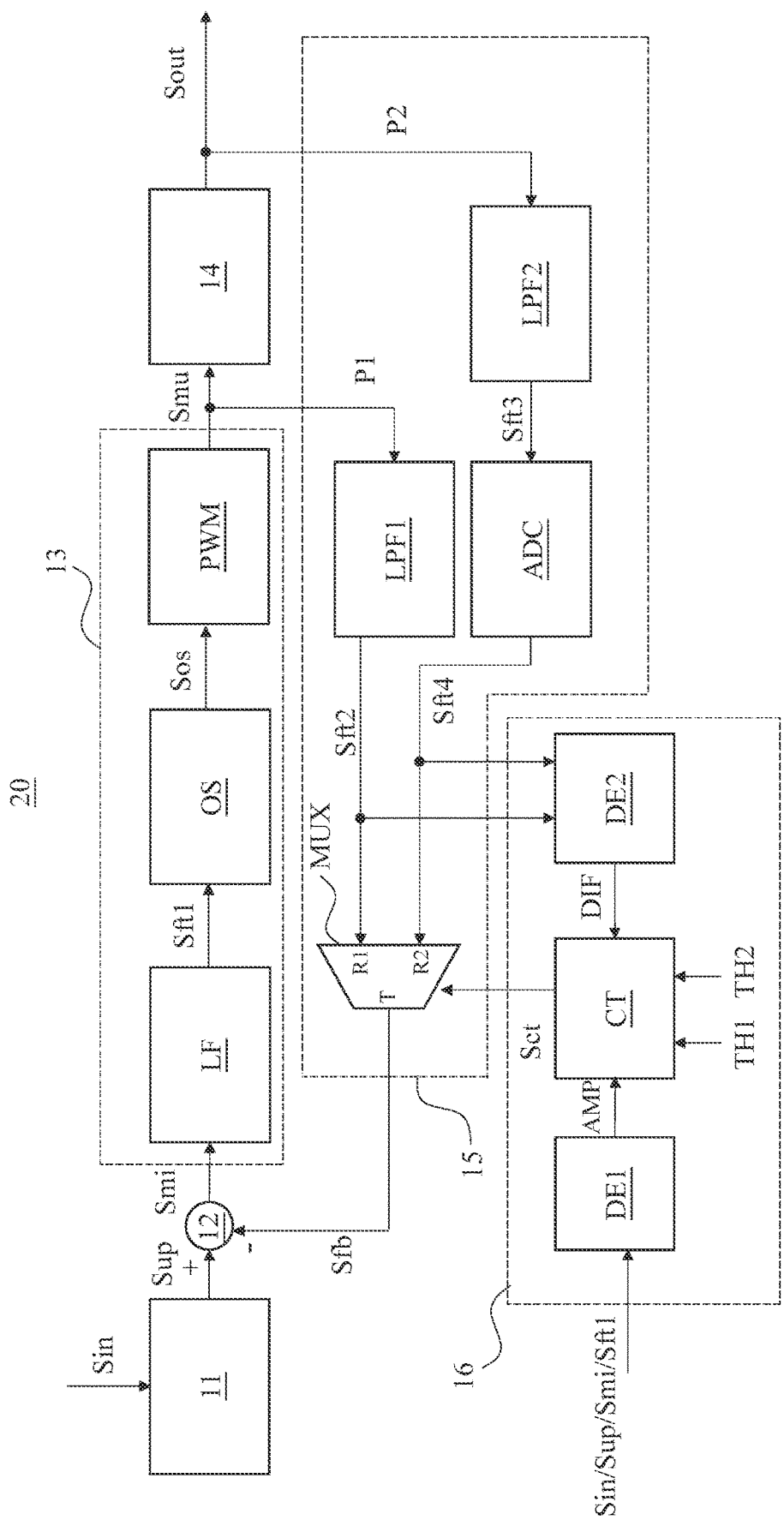
FIG. 2 is a schematic diagram illustrating a signal processor according to some other embodiments of the present disclosure.

In some embodiments, when the audio signal received by the speaker is switched, pop noise may be generated if the difference in signal scale is too drastic. The control circuit 16 is further configured to prevent the pop noise when the multiplexer MUX switches paths using the control signal Sct. Detailed description of this embodiment please refer to FIG. 2. The signal processor 20 illustrated in FIG. 2 is substantially the same as the signal processor 10. For ease of understanding, units of the signal processor 20 follows the reference numerals of those of the signal processor 10.

Compared with the signal processor 10, the control circuit 16 of the signal processor 20 further includes a detector DE2. The detector DE2 is configured to calculate a difference DIF between the amplitude of the filtered signal Sft2 and the amplitude of the converted filtered signal Sft4. The comparator CT is further configured to compare the difference DIF and the second threshold TH2. In other embodiments, the detector DE2 is configured to calculate the difference between the energy of the filtered signal Sft2 at a specific frequency and the energy of the converted filtered signal Sft4 at the specific frequency as the above-mentioned difference DIF. However, the present disclosure is not limited thereto, and any technical solutions capable of determining the difference between signals fall within the scope of the present disclosure.

When the difference DIF is greater than or equal to the second threshold TH2, it means that the amplitude difference of the signals before and after switching is greater than a tolerance, suggesting that pop noise may be generated. The comparator CT generates the control signal Sct, which is configured to instruct the multiplexer MUX to keep coupling the input terminal R1 or the input terminal R2 to the output terminal T, i.e., maintain the current coupling configuration.

In other words, the comparator CT keeps the control signal Sct so that the multiplexer MUX does not switch the coupling configuration.

When the difference DIF is smaller than the second threshold TH2, it means that the amplitude difference of the signals before and after switching is within the tolerance. The comparator CT generates the control signal Sct, which is configured to instruct the multiplexer MUX to switch the coupling configuration of the multiplexer MUX according to the comparison result of the amplitude AMP and the first threshold TH1.

Figure 3:
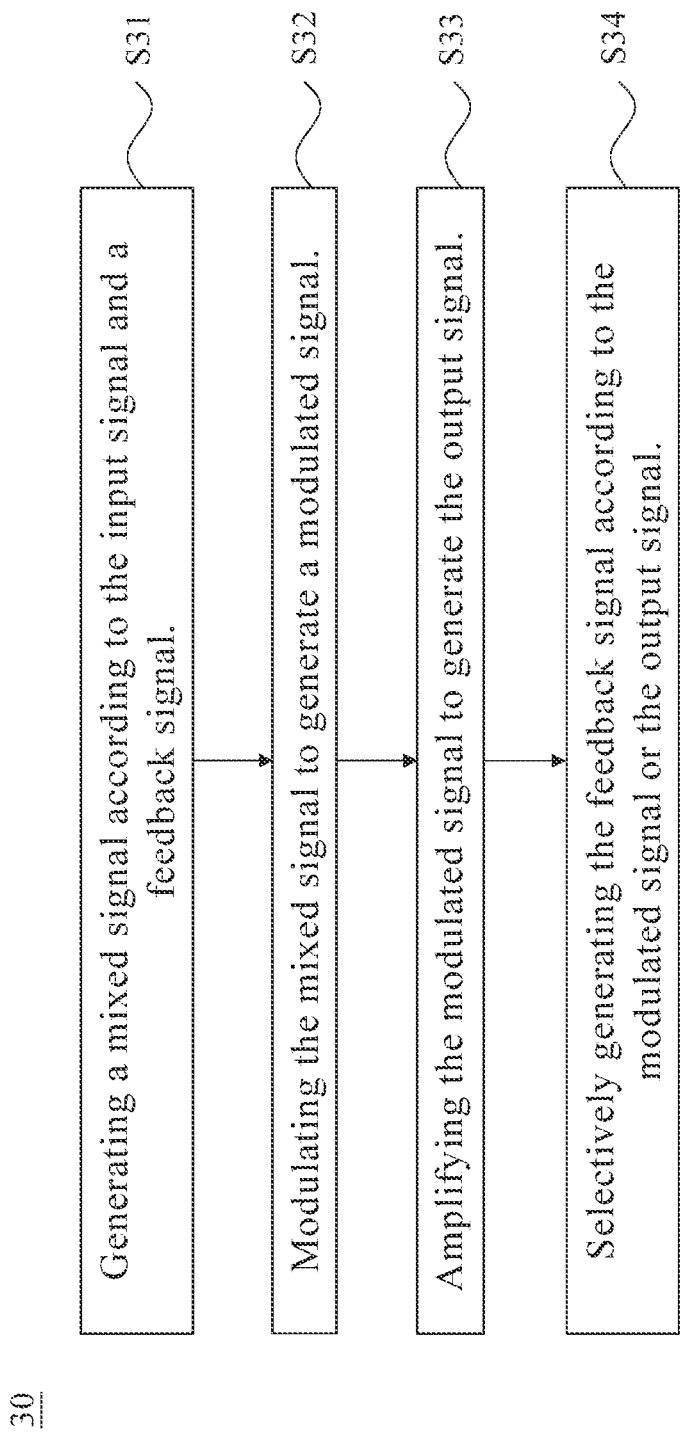
FIG. 3 is a flowchart of a signal processing method according to some other embodiments of the present disclosure.

Reference is made to FIG. 3. FIG. 3 is a flowchart illustrating process steps of the signal processing method 30. In some embodiments, the signal processor 10 of FIG. 1 and the signal processor 20 of FIG. 2 uses the signal processing method 30 to decrease the THD+N of the output signal Sout generated from the input signal Sin. The signal processing method 30 includes steps S31, S32, S33, and S34. For ease of understanding, signal processing method 30 follows the reference numerals used in FIG. 1 and FIG. 2. Further, the signal processing method 30 is not limited to Steps S31-S34. In further embodiments, the signal processing method 30 also includes the steps related to the above-mentioned operations of the signal processor 10 and the signal processor 20.

In Step S31, the mixed signal Smi is generated according to the input signal Sin and the feedback signal Sfb. In Step S32, the mixed signal Smi is modulated to generate the modulated signal Smu. In Step S33, the modulated signal Smu is amplified to generate the output signal Sout. In Step S34, the feedback signal Sfb is selectively generated according to the modulated signal Smu or the output signal Sout. Please refer to the embodiments of FIG. 1 and FIG. 2 for the detailed operations of the signal processor 10 and the signal processor 20 in relation to Steps S31-S34, the detailed operations are omitted herein for the sake of brevity.

What is claimed is:

1. A signal processor, configured to decrease a total harmonic distortion plus noise of an output signal generated from an input signal, comprising:
    a mixer, configured to generate a mixed signal according to the input signal and a feedback signal;
    a pulse-width module, configured to modulate the mixed signal to generate a modulated signal to be outputted from an output terminal of the pulse-width module;
    a power stage circuit, configured to amplify the modulated signal to generate an output signal to be outputted from an output terminal of the power stage circuit;
    a feedback circuit, configured to generate the feedback signal to the mixer selectively according to the modulated signal or the output signal; and
    a control circuit, configured to compare an amplitude of one of the input signal and the mixed signal with a first threshold,
    wherein when the amplitude is smaller than the first threshold, the control circuit instructs the feedback circuit to generate the feedback signal according to the modulated signal, and
    when the amplitude is greater than or equal to the first threshold, the control circuit instructs the feedback circuit to generate the feedback signal according to the output signal.

2. The signal processor of claim 1, wherein the feedback circuit comprises:
    a multiplexer, having a first input terminal, a second input terminal, and an output terminal for outputting the feedback signal, wherein the multiplexer is configured to selectively couple the first input terminal or the second input terminal to the output terminal according to a control signal;
    a first feedback path, coupled between the output terminal of the pulse-width module and the first input terminal of the multiplexer; and
    a second feedback path, coupled between the output terminal of the power stage circuit and the second input terminal of the multiplexer.

3. The signal processor of claim 2, wherein the first feedback path comprises:
    a first low-pass filter.

4. The signal processor of claim 3, wherein the second feedback path comprises:
    a second low-pass filter; and
    an analog-to-digital converter, coupled to an output terminal of the second low-pass filter,
    wherein a passband of the first low-pass filter is substantially identical to a passband of the second low-pass filter.

5. The signal processor of claim 4, wherein the pulse-width module comprises:
    a loop filter, configured to filter the mixed signal to generate a first filtered signal;
    an over-sampler, configured to over-sample the first filtered signal to generate an over-sampled signal; and
    a pulse-width modulator, configured to perform a pulse-width modulation on the over-sampled signal to generate the modulated signal,
    wherein
        the control circuit is further configured to compare the amplitude of one of the input signal, the mixed signal, and the first filtered signal with the first threshold,
        wherein when the amplitude is smaller than the first threshold, the control circuit generate the control signal configured to instruct the multiplexer to select the first input terminal to couple to the output terminal of the multiplexer, and
        when the amplitude is greater than or equal to the first threshold, the control circuit generate the control signal configured to instruct the multiplexer to select the second input terminal to couple to the output terminal of the multiplexer.

6. The signal processor of claim 5, wherein the control circuit comprises:
    a first detector, configured to calculate the amplitude; and
    a comparator, configured to compare the amplitude and the first threshold to generate the control signal.

7. The signal processor of claim 5, wherein the control circuit is further configured to compare a difference between the signals on the first input terminal and the second input terminal with a second threshold,
    wherein when the difference is smaller than the second threshold, the comparator generates the control signal according to a comparison result between the amplitude and the first threshold, and
    when the difference is greater than or equal to the second threshold, the comparator keeps the control signal.

8. The signal processor of claim 7, wherein the control circuit further comprises:
    a second detector, configured to calculate the difference.

9. The signal processor of claim 1, further comprising:
    an up-sampler, configured to up-sample the input signal to generate an up-sampled signal to the mixer.

10. The signal processor of claim 1, wherein the output signal is an audio signal.

11. A signal processing method, configured to decrease a total harmonic distortion plus noise of an output signal generated from an input signal, comprising:
- generating a mixed signal according to the input signal and a feedback signal;
- modulating the mixed signal to generate a modulated signal;
- amplifying the modulated signal to generate the output signal; and
- selectively generating the feedback signal according to the modulated signal or the output signal, comprising:
  - comparing an amplitude of one of the input signal and the mixed signal with a first threshold,
  - wherein when the amplitude is smaller than the first threshold, the feedback signal is generated according to the modulated signal, and
  - when the amplitude is greater than or equal to the first threshold, the feedback signal is generated according to the output signal.

12. The signal processing method of claim 11, wherein the step of selectively generating the feedback signal according to the modulated signal or the output signal comprises:
- filtering the modulated signal to generate a first signal;
- generating a second signal according to the output signal;
- selectively outputting the first signal or the second signal as the feedback signal according to a control signal.

13. The signal processing method of claim 12, wherein the step of generating the second signal according to the output signal comprises:
- filtering the output signal to generate a third signal; and
- performing an analog-to-digital conversion on the third signal to generate the second signal.

14. The signal processing method of claim 13, wherein the step of modulating the mixed signal to generate the modulated signal comprises:
- filtering the mixed signal to generate a filtered signal;
- over-sampling the filtered signal to generate an over-sampled signal; and
- modulating the over-sampled signal to generate the modulated signal.

15. The signal processing method of claim 14, wherein the first threshold is further compared with the amplitude of one of the input signal, the mixed signal, and the filtered signal,
- wherein when the amplitude is smaller than the first threshold, selecting the first signal to output as the feedback signal, and
- when the amplitude is greater than or equal to the first threshold, selecting the second signal to output as the feedback signal.

16. The signal processing method of claim 15, wherein the step of comparing the amplitude of one of the input signal and the mixed signal with the first threshold comprises:
- calculating the amplitude; and
- comparing the amplitude and the first threshold to generate the control signal.

17. The signal processing method of claim 15, wherein the step of selectively outputting the first signal or the second signal as the feedback signal according to the control signal further comprises:
- comparing a difference between an amplitude of the first signal and an amplitude of the second signal with a second threshold,
- wherein when the difference is smaller than the second threshold, generating the control signal according to a comparison result between the amplitude and the first threshold, and
- when the difference is greater than or equal to the second threshold, keeping outputting one of the first signal or the second signal as the feedback signal.

18. The signal processing method of claim 17, wherein the step of comparing the difference between the amplitude of the first signal and the amplitude of the second signal with the second threshold comprises:
- calculating the difference.

19. The signal processing method of claim 11, wherein the step of generating the mixed signal according to the input signal and the feedback signal comprises:
- up-sampling the input signal to generate an up-sampled signal; and
- mixing the up-sampled signal and the feedback signal to generate the mixed signal.

20. The signal processing method of claim 11, wherein the output signal is an audio signal.

* * * * *